United States Patent
Gottin et al.

(10) Patent No.: US 12,438,555 B2
(45) Date of Patent: Oct. 7, 2025

(54) QUALITY OF LOSSY COMPRESSED SENSOR DATA WITH MACHINE LEARNING

(71) Applicant: Dell Products L.P., Round Rock, TX (US)

(72) Inventors: Vinicius Michel Gottin, Rio de Janeiro (BR); Rômulo Teixeira de Abreu Pinho, Niterói (BR); Eduardo Vera Sousa, Niterói (BR); Alex Laier Bordignon, Niterói (BR); Paulo de Figueiredo Pires, Niterói (BR); Franklin Ventura, Niterói (BR)

(73) Assignee: Dell Products L.P., Round Rock, TX (US)

( * ) Notice: Subject to any disclaimer, the term of this patent is extended or adjusted under 35 U.S.C. 154(b) by 341 days.

(21) Appl. No.: 18/158,107

(22) Filed: Jan. 23, 2023

(65) Prior Publication Data

US 2024/0250696 A1 Jul. 25, 2024

(51) Int. Cl.
*H03M 7/00* (2006.01)
*H03M 7/30* (2006.01)

(52) U.S. Cl.
CPC ....... *H03M 7/6005* (2013.01); *H03M 7/3059* (2013.01); *H03M 7/3082* (2013.01)

(58) Field of Classification Search
CPC . H03M 7/6005; H03M 7/3059; H03M 7/3082
See application file for complete search history.

(56) References Cited

U.S. PATENT DOCUMENTS

| | | | |
|---|---|---|---|
| 10,956,787 B2* | 3/2021 | Rothberg | G06N 3/045 |
| 2011/0078222 A1* | 3/2011 | Wegener | H03M 7/30 |
| | | | 708/203 |
| 2012/0084089 A1* | 4/2012 | Lloyd | G10L 15/20 |
| | | | 704/500 |

OTHER PUBLICATIONS

Ruxanayasmin, et al., Implementation of Data Compression Techniques in Mobile Ad hoc Networks; International Journal of Computer Applications vol. 80—No. 8, Oct. 2013.

* cited by examiner

*Primary Examiner* — Jean B Jeanglaude
(74) *Attorney, Agent, or Firm* — Workman Nydegger (57) ABSTRACT

The quality of decompressed data that was compressed in a lossy manner to generate lossy compressed data, is improved. Lossy compressed data may be generated at a device and transmitted to a gateway. The gateway includes a reconstruction engine that is trained to reduce the compression loss by generating a learned residue. The residue is added to the lossy decompressed data to generated corrected decompressed data that has a smaller loss than the lossy decompressed data.

20 Claims, 9 Drawing Sheets

QUALITY OF LOSSY COMPRESSED SENSOR DATA WITH MACHINE LEARNING

FIELD OF THE INVENTION

Embodiments of the present invention generally relate to machine learning and data compression/decompression. More particularly, at least some embodiments of the invention relate to systems, hardware, software, computer-readable media, and methods for decompressing data with machine learning to improve data quality.

BACKGROUND

The world is becoming increasingly connected through the use of IoT (Internet of Things). The number of devices (e.g., sensors, smart sensors, wearables, machinery, server telemetry) connected to the Internet (or other networks) continues to increase at a rapid pace. Many of these devices collect, generate, and/or transmit data of various kinds and types.

These devices may or may not have processing capability. As a result, the data transmitted by the devices may be raw and unprocessed. Other devices have some compute ability and the data transmitted by these devices may be processed to some degree. The amount of processing, however, can depend on the processing capabilities of the device.

In addition, these devices are typically connected to a gateway, which may be on the edge or in the cloud. The gateway typically includes comparatively more processing power (processors, memory, and other hardware) that allows the data to be further processed.

In many cases, the data generated by these devices is time series data and the amount of data generated can be very large. Transmitting large amounts of data requires energy and many devices may have limited power (e.g., battery power). When the data is transmitted, for example using radio frequencies, there is a cost in terms of energy. The data being transferred also incurs a cost from a bandwidth perspective.

To reduce transmission requirements, devices may compress data prior to transmission. Compression can reduce the number of bits to be transmitted. This is beneficial because transmitting a smaller amount of data saves energy and compression techniques consume comparatively less energy. There is a trade-off associated with compressing data at the device. Although higher compression levels may extend battery life and reduce transmission costs, higher compression levels may also incur higher data loss.

Further, many devices are deployed with an embedded compression algorithm that cannot be changed. Although these embedded compression algorithms are often low energy techniques and are memory bound, they are often unable to exploit all patterns in a dataset.

BRIEF DESCRIPTION OF THE DRAWINGS

In order to describe the manner in which at least some of the advantages and features of the invention may be obtained, a more particular description of embodiments of the invention will be rendered by reference to specific embodiments thereof which are illustrated in the appended drawings. Understanding that these drawings depict only typical embodiments of the invention and are not therefore to be considered to be limiting of its scope, embodiments of the invention will be described and explained with additional specificity and detail through the use of the accompanying drawings, in which.

DETAILED DESCRIPTION OF SOME EXAMPLE EMBODIMENTS

Embodiments of the present invention generally relate to machine learning and to improving the quality of lossy compressed data. More particularly, at least some embodiments of the invention relate to systems, hardware, software, computer-readable media, and methods for post-processing lossy compressed data to reduce data loss.

In general, example embodiments of the invention relate to improving the quality of a signal (data) compressed using lossy compression techniques without requiring the transmission of additional data or bits. Embodiments of the invention exploit patterns in the dataset during decompression to decrease the error associated with information loss. Embodiments of the invention thus improve the quality of reconstructed signals without increasing the complexity of energy expenditure at the device that transmitted the lossy compressed data.

As previously stated, compression algorithms employed in devices such as IoT devices are often energy efficient. These compression algorithms may compress data in a lossy manner and do not remove all data redundancies. A conventional approach to reducing data loss during compression focuses on data patterns during compression. This, however, is expensive from a computation complexity perspective and is often not feasible in the context of many devices such as sensors. The process of compressing time series data to achieve the best compression ratios and rates is computationally expensive and is not always advisable in scenarios where the compressor has low computational power.

Embodiments of the invention operate on the lossy compressed data during the decompression stage to improve the quality of the data after the data has been transmitted to a reconstruction engine (e.g., a gateway). The reconstruction engine or, more specifically, a reconstruction model included in the reconstruction engine, may be a neural network of different kinds. For example, the reconstruction model may be or include a multilayer perceptron (MLP), a transformer based architecture, or other type. Example compression techniques performed at devices include discrete cosine transform (DCT) techniques and error-bounded lossy compression techniques such as energy efficient sensor data streaming or refined lightweight temporal compression (RLTC).

Example embodiments of the invention learn the patterns of information loss associated with a compression technique. Learning these patterns allows the reconstruction engine to reduce compression errors and thereby improve the quality of the decompressed or reconstructed data. Advantageously, this allows at least part of the information lost in the compression process to be recovered using the processing power of the cloud or edge.

In one example, the reconstruction engine, which may be instantiated at the edge or in the cloud and which includes a machine learning model, receives lossy compressed data from sensors. The lossy compressed data is initially decompressed (reconstructed) with some loss of quality due to the manner in which the data was compressed. The reconstructed data is then passed through a reconstruction model that has been trained to improve the quality of the reconstructed data.

Because compression algorithms tend to make mistakes in roughly the same cases, the reconstruction model is able to learn these cases and to correct these cases, thereby improving the quality of the reconstructed data. In one example, the reconstruction model is applied at the gateway during the decompression process. As a result, the reconstruction engine and reconstruction model do not impose additional energy requirements on the device that generated and transmitted the lossy compressed data. Stated differently, the error loss associated with data compression at the devices can be reduced using the same transmission bandwidth. The quality of the reconstructed data is improved.

Experiments, discussed in more detail below, demonstrate that embodiments of the invention can significantly reduce the compression error for various types of lossy compressed data. Embodiments of the invention were able to increase the reconstructed signal quality for a collection of 10 heterogeneous IoT sensor datasets from 17 db to 21 db on the PSNR (Peak Signal to Noise Ratio) metric, representing an approximately 20% gain in signal quality. Embodiments of the invention are generally compatible with various compression algorithms and can be deployed without modifying devices that are already deployed.

The reconstruction engine, in one example, learns patterns that the original compression algorithm was not able to explore or exploit during the data decompression stage using low-cost computing at the edge/cloud.

In embodiments of the invention, patterns of both compressed and uncompressed data are explored and/or exploited. This allows the reconstruction engine, once trained, to reduce the compression loss and improve the quality of the reconstructed data.

Figure 1:
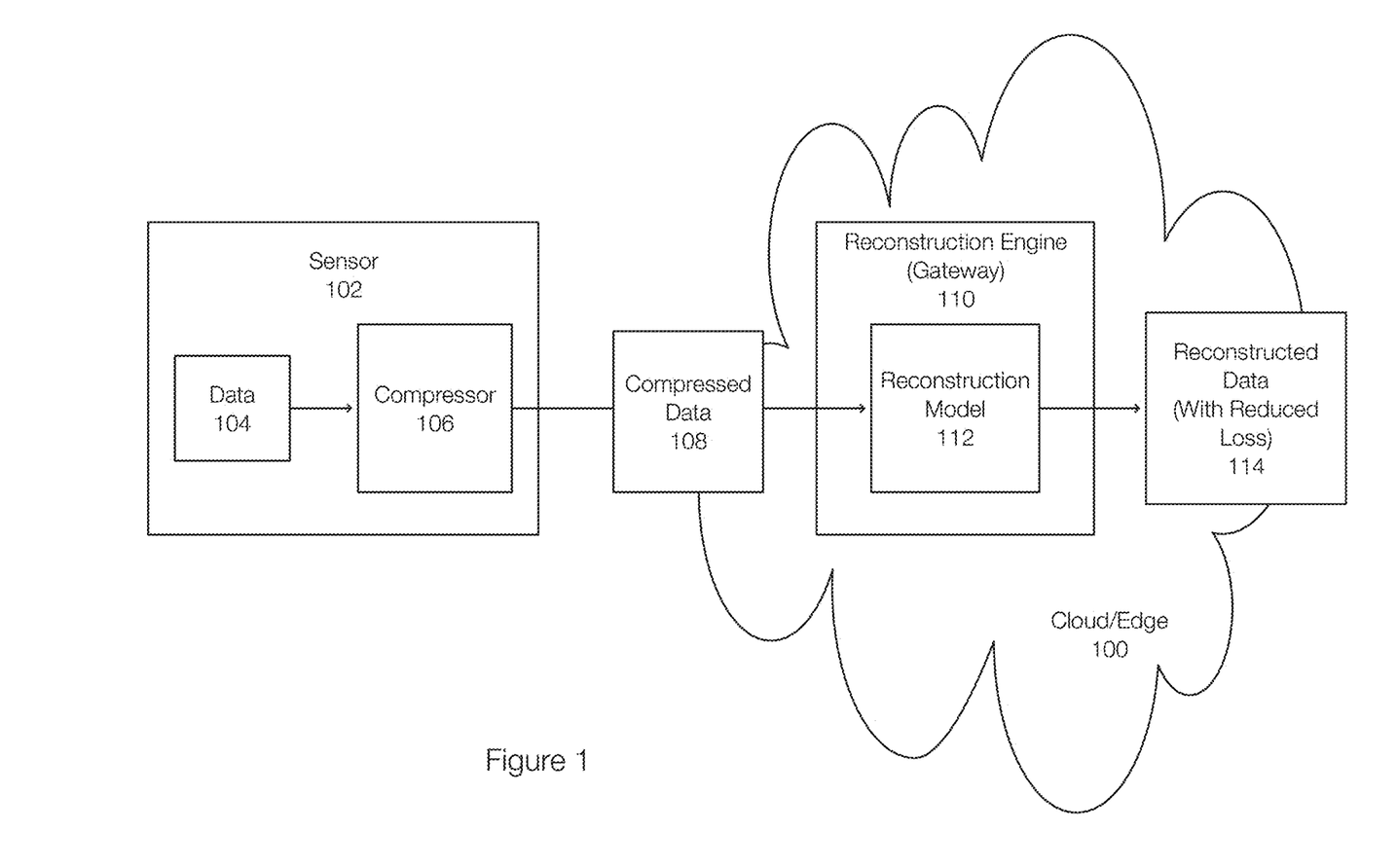
FIG. 1 discloses aspects of reducing signal loss in lossy compressed data.

FIG. 1 discloses aspects of reducing signal loss in lossy compressed data. FIG. 1 illustrates a reconstruction engine 110 that includes a reconstruction model 112. The reconstruction engine 110 may be located in the cloud or in the edge (cloud/edge 100) and may include processors, memory, and other computing hardware and resources. The reconstruction engine 110 may include or run on one or more virtual machines, containers, servers, or the like.

The reconstruction model 112 receives compressed data 108 from a sensor 102, which may be configured with a compressor 106 to compress data 104 generated at or collected by the sensor 102. The compressed data 108 is an example of lossy compressed data. Thus, some of the original data 104 was lost during the compression performed by the compressor 108.

The reconstruction engine 110 operates on the compressed data 108 to recover or estimate some of the lost data. Thus, the output of the reconstruction engine 110 or more specifically the reconstruction model 112 is reconstructed data 114. The reconstructed data 114 has reduced loss compared with data that is simply decompressed at a gateway. Stated differently, the reconstructed data 114 has improved quality compared to simply decompressing the compressed data 108.

Figure 2A:
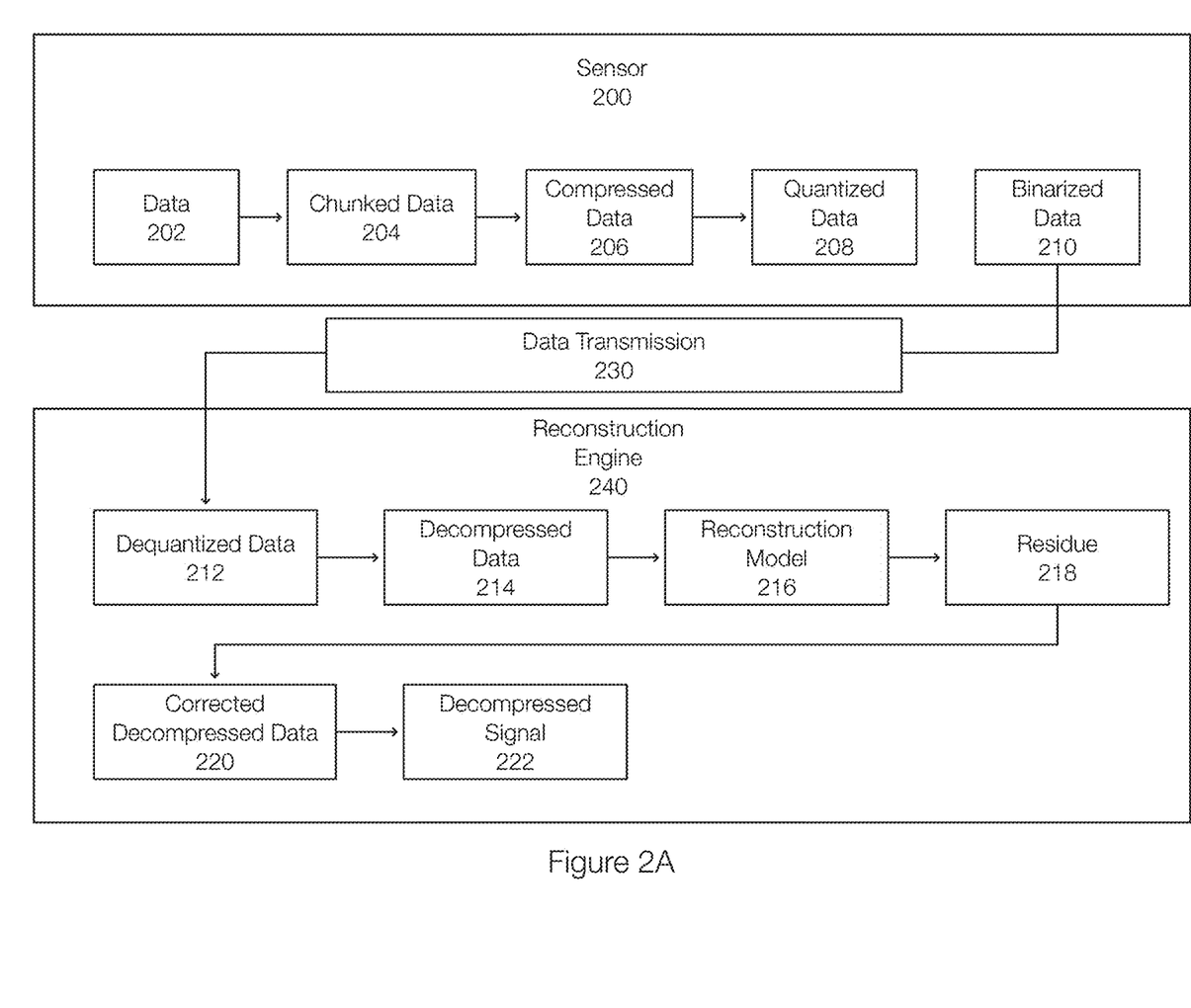
FIG. 2A discloses additional aspects of reducing signal loss in lossy compressed data.
Figure 2B:
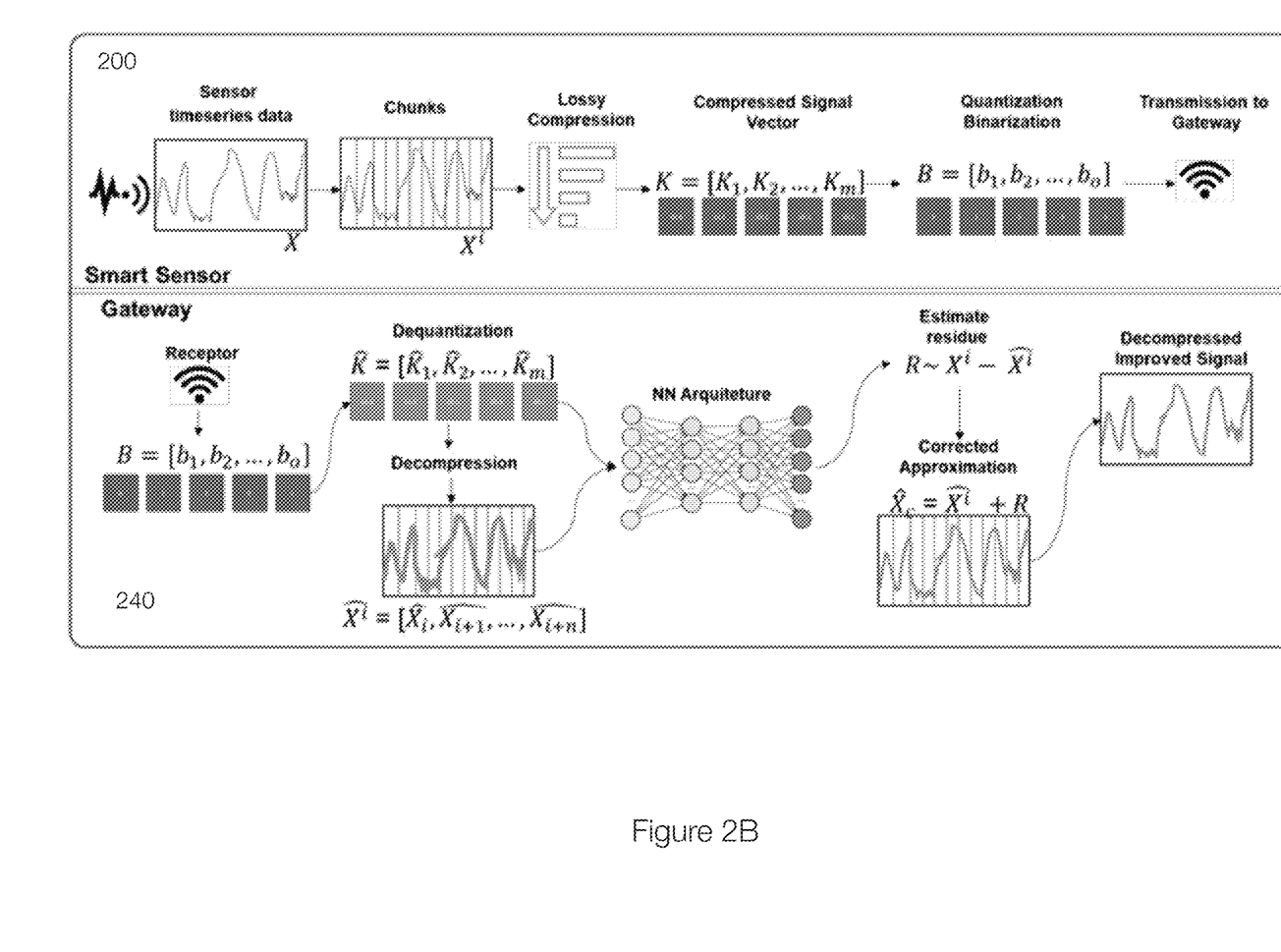
FIG. 2B illustrates a view of FIG. 2A with mathematical notations.

FIG. 2A discloses aspects of reducing data loss in lossy compressed data. FIG. 2B illustrates a view of FIG. 2A with mathematical notations.

FIG. 2A illustrates a sensor 200, which is an example of a device such as an IoT device. The sensor 200 may collect or generate data. In one example, the data 202 generated at the sensor 200 is multivariate or univariate time series data. Time series data includes data that is collected/generated over time. For example, a sensor may be configured to periodically sample a voltage, current, temperature, velocity, direction, or the like or combination thereof. The time series data represents how the samples change over time.

The data 202 may be represented as a sequence of samples:

$$X = [X_1, X_2, \ldots, X_{nsamples}].$$

The sequence X, represented by the data 202, may be captured, processed and transmitted to the reconstruction engine 240. Stated differently, the sensor may capture, process and transmit data in the form of sequences. Thus, the reconstruction engine 240 may repeatedly receive sequences of data from the sensor 200.

When the sequence of data 202 is being prepared or processed for transmission to the reconstruction engine 240, the sequence may be broken into chunks of size n (the chunked data 204). The chunked sequence may be represented as: $X^i = X_i, X_{i+1}, \ldots, X_{i \times n}$. Each sample $X^i$ can be processed at the sensor 200 and transmitted to the reconstruction engine 240 separately and individually. In one example, n is in a range of 8 to 32 samples or chunks.

The chunked data 204, which may be an array, is then compressed 206 to generate compressed data 206. The compression performed at 206 is lossy. The compression performed by a compressor to generate the compressed data 206 is configured to reduce the size of the data and generate an approximate representation for $X^i$. In one example, the compressed data is represented by: $K = [K_1, K_2, \ldots, K_m]$. If DCT is used, this sequence represents the coefficients of DCT. In the case of RLTC, this sequence represents the values and positions of the encoded data. K is an array of values and is an approximate representation of $X^i$.

Next, the sequence K is quantized to generate quantized data 208. The quantized data 208 is binarized to generate binarized data 210. The binarized data is represented as:

$$B = [b_1, b_2, \ldots, b_o].$$

The quantization and binarization are performed such that an approximation of K can be reconstructed from B. Thus, the sequence B is transmitted (data transmission 230) to the reconstruction engine 240. The binarized data B is dequantized to generate dequantized data 212. The dequantized data 210 is then decompressed to generate decompressed data 214. The decompressed data is an approximation of the original data 202 and is represented by:

$$\hat{X^i} = [\hat{X}_i, \overrightarrow{X_{i+1}}, \ldots, \overrightarrow{X_{i+n}}].$$

$\widehat{X^l}$ is the decompressed version of the chunk $X^i$ that was compressed at the sensor 200. The greater the distance between $\hat{X}^l$ and $X^i$, the greater the compression error.

Embodiments of the invention next run the decompressed data $X^l$ 214 through the reconstruction model 216, which may be a neural network, to reduce the compression error. The reconstruction model 216 may generate a residue (R) 218 that can be added to the decompressed data 214 to reduce the distance. By reducing the distance, the compression error is reduced. Thus, the corrected compressed data 220 is represented as: $\widehat{X^c} = \hat{X}^l + R$. When corrected, the distance between $\widehat{X^c}$ and $\hat{X}^l$ is smaller than the distance between $\hat{X}^l$ and $\hat{X}^l$. Thus, the compressed error is smaller and the quality of the reconstructed data has been improved by the reconstruction engine 240.

More specifically in one embodiment, the input to the reconstruction model 216 includes the decompressed data $\hat{X}^l$ 214 being reconstructed and past sequences that have been decompressed. The past sequences are represented as:

$\widehat{X_{past}} = [\widehat{X_{l-1}}, \widehat{X_{l-2}}, \ldots, \widehat{X_{l-nlags}}]$, where the size of $\widehat{X_{past}}$ is a parameter and represents the number of past samples provided as input to the reconstruction model 216, which is the parameter nlags.

The output of the reconstructed model is a residue 218 (residual), which may be expressed as: $R = X^i - \hat{X}^l$. The decompressed signal 222 or data is output by the reconstruction engine 240.

Figure 3:
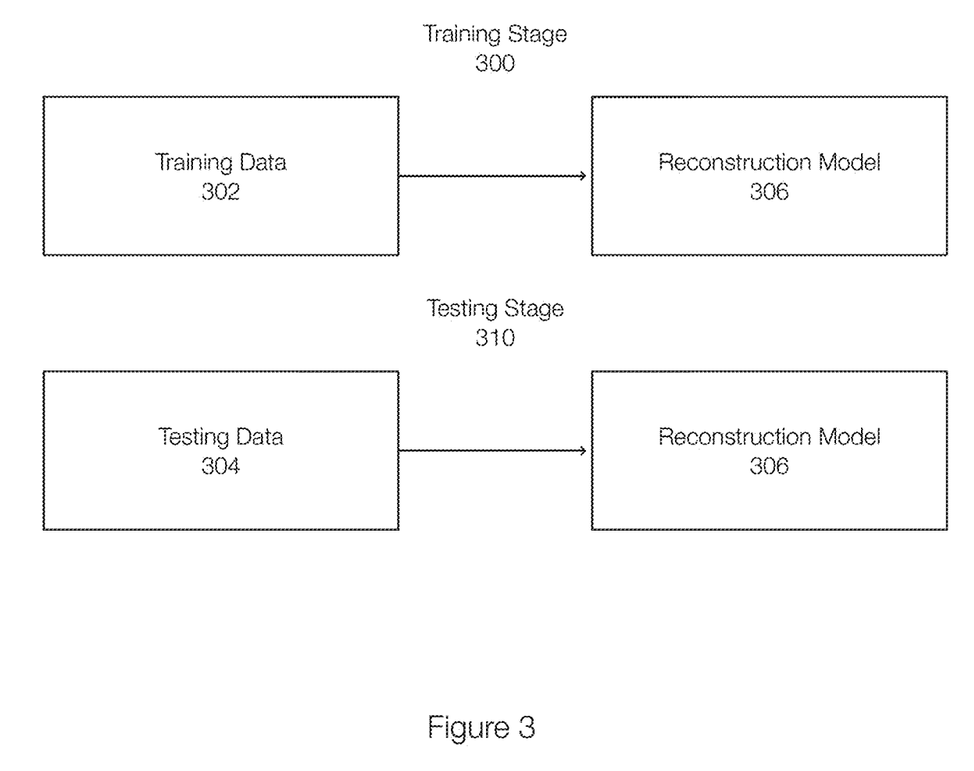
FIG. 3 discloses aspects of training a reconstruction model.

FIG. 3 discloses aspects of training a reconstruction model. Training a reconstruction model may include a training stage 300 and a testing stage 310. During the training stage 300, the reconstruction model 306 is trained with training data 302. During the testing stage, the reconstruction model 306 is tested or validated with testing data 304. The testing data 304, in one example, is similar to the training data 302, but is not used for training the reconstruction model 306.

More specifically, training the reconstruction model 306 may require training data. The training data 302 may be obtained from the device. In one example, the training data 302 is obtained from the device when in a working mode prior to being in a production mode. In one example, raw samples ($X = [X_1, X_2, \ldots, X_{nraw}]$) are obtained. The set of raw samples is separated into a set of training data 302 and a set of testing data 304. The testing data 304 may be, in one example, about 25% of the raw samples.

For each sample in the raw samples used as the training data 302, a chunk is constructed as follows: $X^i = [X_i, X_{i+1}, \ldots, X^{i+n}]$. The input vectors to the reconstruction model 306 are generated by concatenating the vectors $\widehat{X^l}$, $\hat{K}$, $\widehat{X_{past}}$. The input vector has dimension of n+m+nlags. The residue vector is generated as $R = X^i - \widehat{X^l}$ by the reconstruction model 306. The testing data 304 can be used to test or validate the trained reconstruction model 306.

In one example, the reconstruction model 306 may be based on a regression algorithm that accepts multiple inputs and outputs to estimate the residue. In one example, an MLP network with three layers and with ReLu as the activation function may be used. In another example, a neural network with a transformer architecture that includes a self-attrition mechanism with a final feed forward layer may be used.

Figure 4:
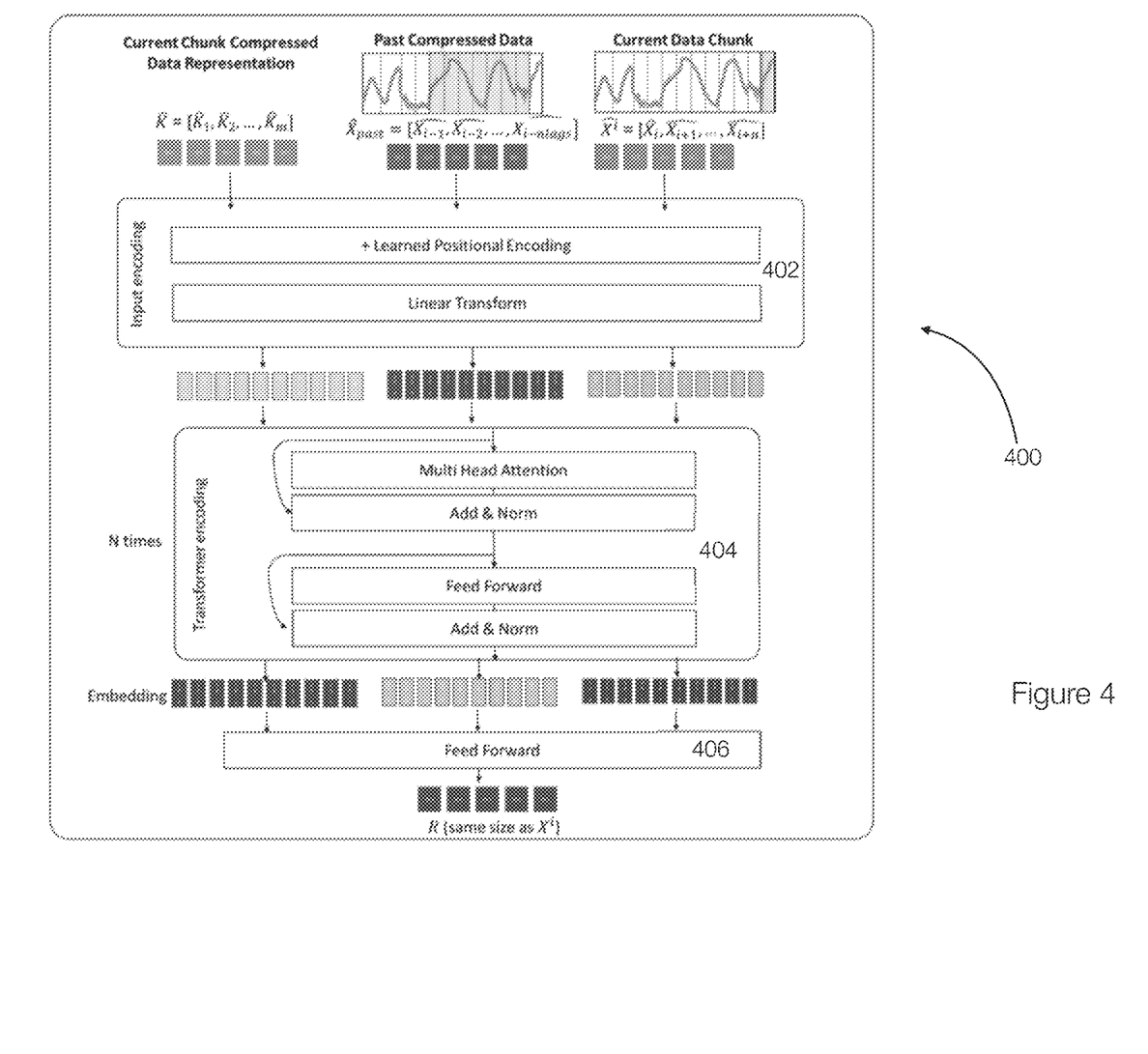
FIG. 4 discloses aspects of a transformer-based reconstruction model.

FIG. 4 discloses aspects of an example transformer-based architecture. In the reconstruction model 400, the input encoding block 402 includes a learned positional encoder and a linear transform. The learned positional encoder adds values such as parameters of the model to the input. The parameters of the linear transform are learned. The transformer encoding block 404 receives the output of the input encoding block 402. The transformer encoding block 404 includes, in this example, four layers. The multi-head attention layer allows the model to attend to different parts of the input sequence at the same time. This allows the transformer to learn relationships between different parts of the input sequence that may be far apart.

The second layer is an add & norm layer. This layer adds the vectors from the self-attention layer and input and then normalizes the result. The third layer is a feed-forward layer, which outputs a sequence of vectors that are the same length as the input sequence. The third layer includes a dense neural network with ReLu activations, with inputs and outputs of the same dimension. The fourth layer is another add & norm layer, which adds the vectors from the output of the second layer and the output of the feed-forward layer and then performs normalization.

The transformer encoding block 404 may be applied multiple times in a sequential manner. The output of the transformer encoding block 404 is provided to a final feed-forward layer 406, which outputs the final vectors that are used for predicting the residual of the chunk.

Figure 5:
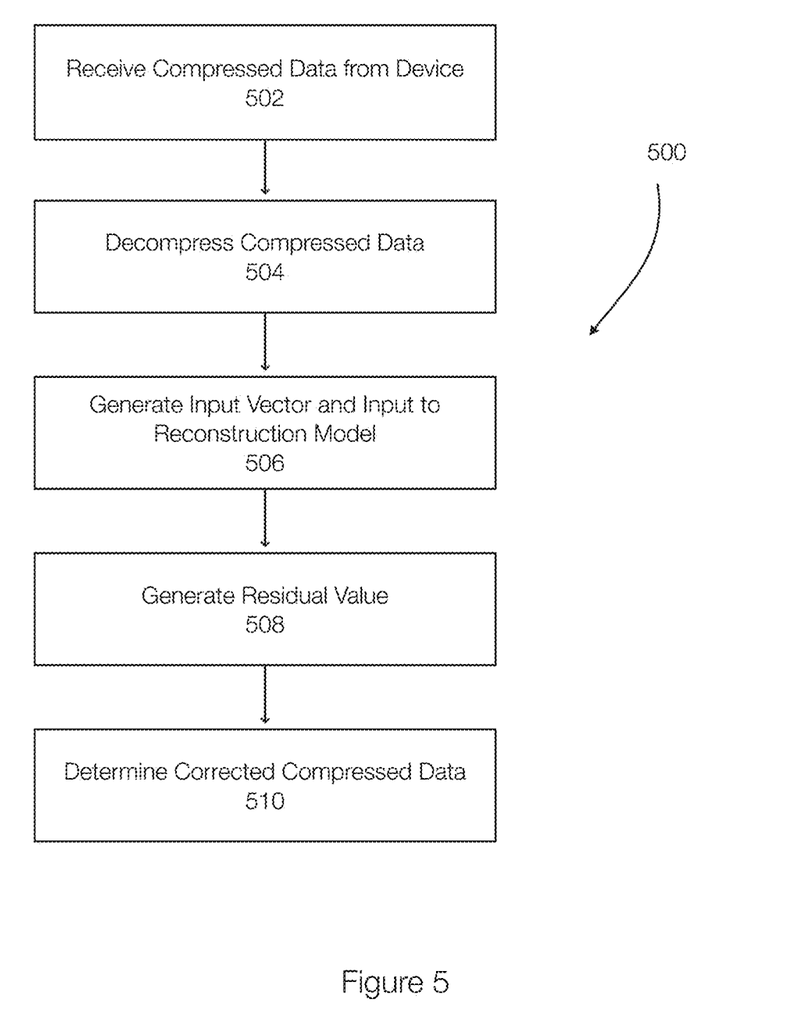
FIG. 5 discloses aspects of generating corrected data from lossy compressed data.

FIG. 5 discloses aspects of generating corrected decompressed data from lossy compressed data. The method 500 includes receiving 502 lossy compressed data from a device such as a sensor. The method 500 may be performed for data received from multiple devices and generated corrected data for each of the different devices or data streams.

The lossy compressed data is decompressed 504 at the reconstruction engine. As previously stated, the decompressed data is different (lossy) from the original data due in part to the lossy compression performed at the device. Embodiments of the invention operate to reduce the compression loss or, stated differently, to improve the quality of reconstructed data.

Once the data is decompressed, an input vector is generated and input 506 to a reconstruction model, which has been previously trained. The input vector is generated by concatenating the decompressed data ($\widehat{X^l}$), reconstructed quantized data ($\hat{K}$), and at least one past sequence or sample ($\hat{X}_{past}$). The reconstruction model then generates 508 a residual value (R). The corrected compressed data is generated 510 from the decompressed data and the residual output by the reconstruction model.

Figure 6A:
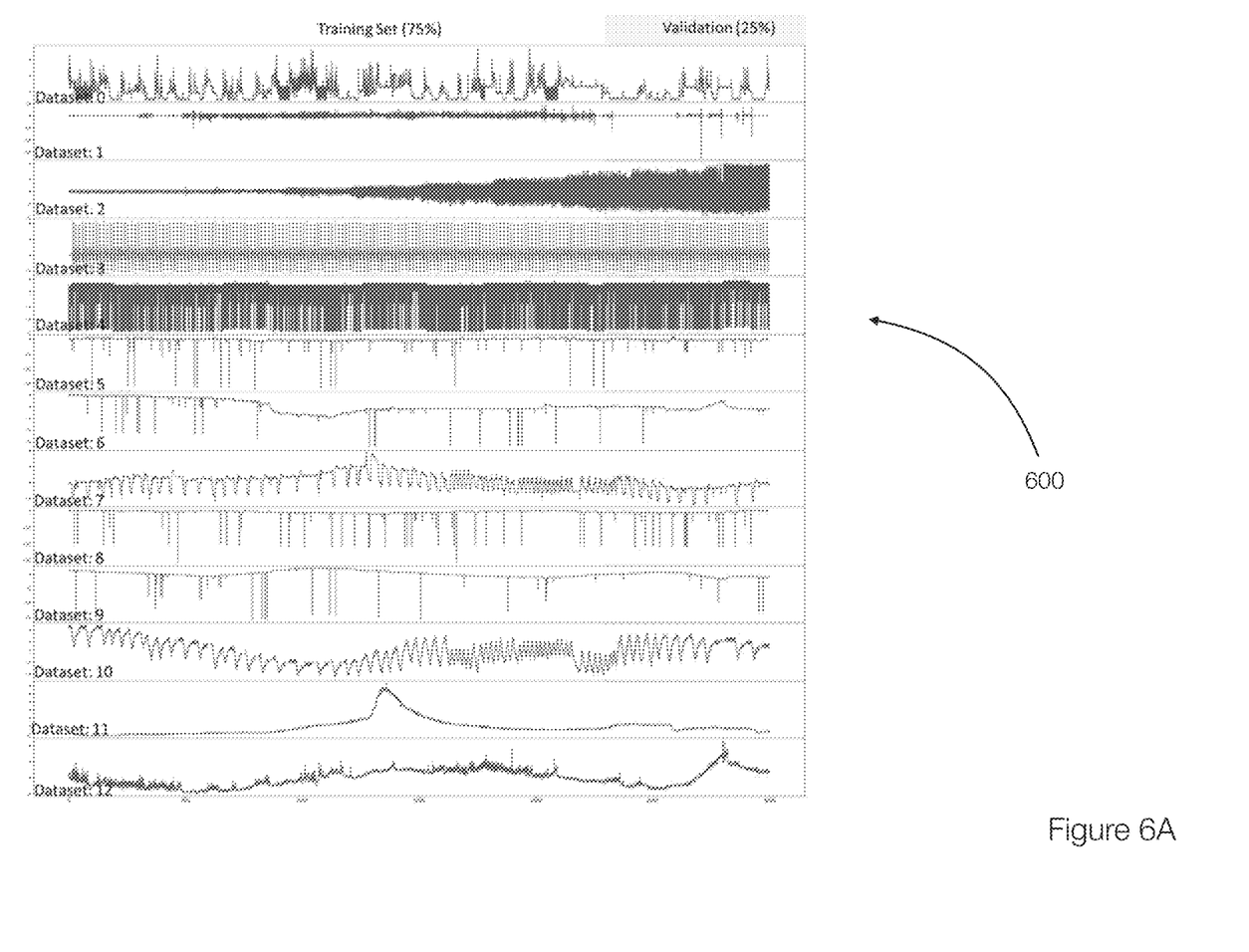
FIGS. 6A, 6B and 6C disclose aspects of experiments in generating corrected data from lossy compressed data.
Figure 6B:
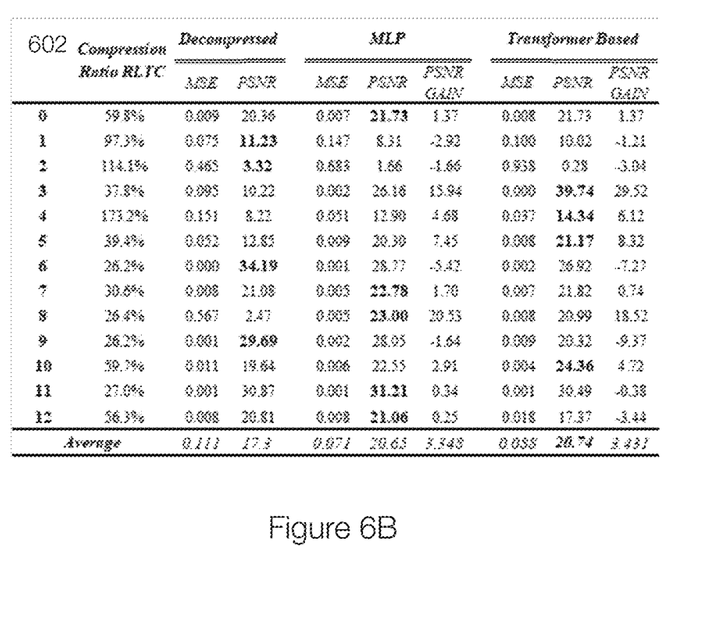
Figure 6C:
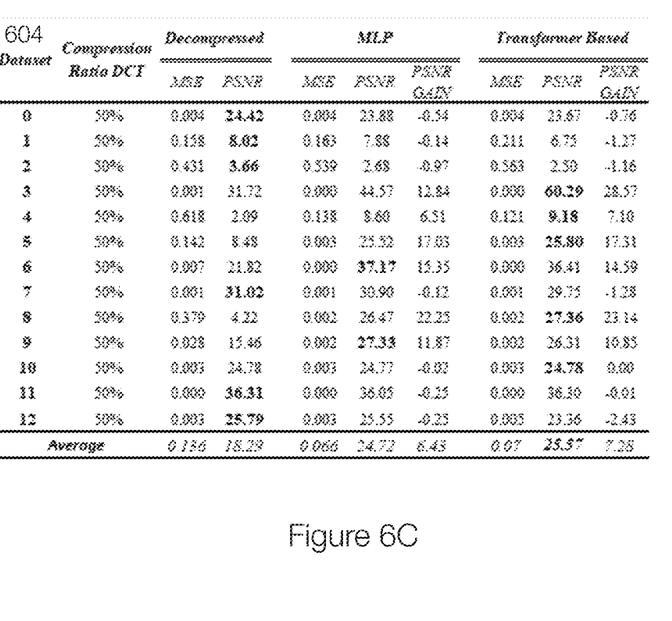

FIGS. 6A, 6B and 6C discloses results of empirical experiments to generated corrected data from lossy compressed data. In one example, experiments were performed on datasets 600 illustrated in FIG. 6A. The datasets 600 were selected to represent different classes of IoT time series data. Each of the datasets 600 includes 30,000 samples and were normalized to zero mean and unit variance. Each dataset was separated into training data and validation or testing data at a ratio of 75% for training data and 25% for testing data.

To train the neural networks, the data was broken into blocks of 16 samples, which represents the parameter n. The parameter nlags, which represents the number of passed samples was 32. One of the reconstruction models tested was an MPL model with 3 layers of 256 neurons and using ReLU as activation. For the transformer architecture the embedding dimension used was 126, with 3 layers of transformers, and with 8 heads in the attention mechanism.

In this case the activation function was GeLU. The algorithm for training the networks was Adam with a learning rate of 0.001.

In these experiments, two compression algorithms, RLTC and DCT, were used to compress the data and embodiments of the invention were applied to reduce the compression error. The table 602 in FIG. 6B illustrates the results of compression (using RLTC) and decompression as applied to only the validation or testing data. The decompressed column illustrates MSE and PSNR metrics without embodiments of the invention.

The MLP column illustrates MSE, PSNR, and PSNR Gain when the reconstruction engine used the MLP architecture in the reconstruction model. The transformer based column in the table 602 presents the metrics applying embodiments of the invention with transformer-based architecture in the reconstruction model. The RLTC algorithm was parameterized for a maximum error of 0.1, and the compression ratios obtained are in the Compression Ratio RLTC column. Because RLTC is adaptive, the compression ratios are variable, and for certain datasets the size of the compressed data can be larger than the original data.

The table 602 illustrates that the method did not obtain positive results in 4 out of 13 tested datasets. In these cases, the effectiveness of the reconstruction engine or model can be detected and, when not beneficial, the reconstruction model may not be activated during production. The best results were achieved using the transformer-based architecture on average, with an average gain of 3.4 Db on the PSNR metric.

The table 604 in FIG. 6C contains similar information, but for the DCT compression. The table 602 in FIG. 6C presents the result of the method using the DCT compression algorithm parameterized for a compression rate of 50%. In this experiment the method using the transformer-based architecture also obtained the best result with an average gain of 7.28 Db on the PSNR metric.

The following is a discussion of aspects of example operating environments for various embodiments of the invention. This discussion is not intended to limit the scope of the invention, or the applicability of the embodiments, in any way.

In general, embodiments of the invention may be implemented in connection with systems, software, and components, that individually and/or collectively implement, and/or cause the implementation of, data compression operations, decompression operations, data reconstruction operations, loss reduction operations, data quality improvement operations, and the like or combinations thereof. More generally, the scope of the invention embraces any operating environment in which the disclosed concepts may be useful.

New and/or modified data collected and/or generated in connection with some embodiments, may be stored in a storage environment that may take the form of a public or private cloud storage environment, an on-premises storage environment, and hybrid storage environments that include public and private elements. Any of these example storage environments, may be partly, or completely, virtualized. The storage environment may comprise, or consist of, a datacenter which is operable to service operations initiated by one or more clients or other elements of the operating environment.

Example cloud computing environments, which may or may not be public, include storage environments that may provide data protection functionality for one or more clients. Another example of a cloud computing environment is one in which processing, data protection, and other services may be performed on behalf of one or more clients. Some example cloud computing environments in connection with which embodiments of the invention may be employed include, but are not limited to, Microsoft Azure, Amazon AWS, Dell EMC Cloud Storage Services, and Google Cloud. More generally however, the scope of the invention is not limited to employment of any particular type or implementation of cloud computing environment.

In addition to the cloud environment, the operating environment may also include one or more clients that are capable of collecting, modifying, creating, compressing, decompressing, and reconstructing data. As such, a particular client may employ, or otherwise be associated with, one or more instances of each of one or more applications that perform such operations with respect to data. Such clients may comprise physical machines, containers, or virtual machines (VMs).

Particularly, devices in the operating environment may take the form of software, physical machines, containers or VMs, or any combination of these, though no particular device implementation or configuration is required for any embodiment. Similarly, data system components such as databases, storage servers, storage volumes (LUNs), storage disks, services, servers, and clients, for example, may likewise take the form of software, physical machines, containers, or virtual machines (VMs), though no particular component implementation is required for any embodiment.

As used herein, the term 'data' is intended to be broad in scope. Thus, that term embraces, by way of example and not limitation, time series data, chunks, objects, sampled signals, device outputs, and the like.

It is noted that any operation(s) of any of the methods disclosed herein may be performed in response to, as a result of, and/or based upon, the performance of any preceding operation(s). Correspondingly, performance of one or more operations, for example, may be a predicate or trigger to subsequent performance of one or more additional operations. Thus, for example, the various operations that may make up a method may be linked together or otherwise associated with each other by way of relations such as the examples just noted. Finally, and while it is not required, the individual operations that make up the various example methods disclosed herein are, in some embodiments, performed in the specific sequence recited in those examples. In other embodiments, the individual operations that make up a disclosed method may be performed in a sequence other than the specific sequence recited.

Following are some further example embodiments of the invention. These are presented only by way of example and are not intended to limit the scope of the invention in any way.

Embodiment 1. A method comprising: receiving, at a reconstruction engine over a network, a sequence of lossy compression data that has been generated at a device, decompressing the lossy compression data to generate decompressed data, providing the lossy compression data as input to a reconstruction model associated with the reconstruction engine to generate a residue, and generating corrected decompressed data by combining the decompressed data with the residue.

Embodiment 2. The method of embodiment 1, wherein the lossy compression data comprises a compressed signal vector that has been quantized and binarized, the compressed signal vector comprising an array of values associated with the compression performed at the device.

Embodiment 3. The method of embodiment 1 and/or 2, further comprising generating a reconstructed compressed signal vector by reversing the binarization and quantization performed on the compressed signal vector.

Embodiment 4. The method of embodiment 1, 2, and/or 3, wherein the input to the reconstruction model further comprises the reconstructed compressed signal vector and at least one past sequence of lossy compression data.

Embodiment 5. The method of embodiment 1, 2, 3, and/or 5, further comprising adding the residue to the decompressed data.

Embodiment 6. The method of embodiment 1, 2, 3, 4, and/or 5, wherein the reconstruction model comprises a transformer-based neural network model or an MLP (Multilayer Perceptron) model.

Embodiment 7. The method of embodiment 1, 2, 3, 4, 5, and/or 6, wherein the sequence comprises a plurality of samples generated at the device.

Embodiment 8. The method of embodiment 1, 2, 3, 4, 5, 6, and/or 7, further comprising training the reconstruction model using historical sequences of raw data from the device.

Embodiment 9. The method of embodiment 1, 2, 3, 4, 5, 6, 7, and/or 8, wherein a portion of the historical sequences are used as training data and a second portion of the historical sequences are used as testing data.

Embodiment 10. The method of embodiment 1, 2, 3, 4, 5, 6, 7, 8, and/or 9, further comprising outputting a decompressed signal.

Embodiment 11. A system, comprising hardware and/or software, operable to perform any of the operations, methods, or processes, or any portion of any of these, or any combination thereof, disclosed herein.

Embodiment 12. A non-transitory storage medium having stored therein instructions that are executable by one or more hardware processors to perform operations comprising the operations of any one or more of embodiments 1-11.

The embodiments disclosed herein may include the use of a special purpose or general-purpose computer including various computer hardware or software modules, as discussed in greater detail below. A computer may include a processor and computer storage media carrying instructions that, when executed by the processor and/or caused to be executed by the processor, perform any one or more of the methods disclosed herein, or any part(s) of any method disclosed.

As indicated above, embodiments within the scope of the present invention also include computer storage media, which are physical media for carrying or having computer-executable instructions or data structures stored thereon. Such computer storage media may be any available physical media that may be accessed by a general purpose or special purpose computer.

By way of example, and not limitation, such computer storage media may comprise hardware storage such as solid state disk/device (SSD), RAM, ROM, EEPROM, CD-ROM, flash memory, phase-change memory ("PCM"), or other optical disk storage, magnetic disk storage or other magnetic storage devices, or any other hardware storage devices which may be used to store program code in the form of computer-executable instructions or data structures, which may be accessed and executed by a general-purpose or special-purpose computer system to implement the disclosed functionality of the invention. Combinations of the above should also be included within the scope of computer storage media. Such media are also examples of non-transitory storage media, and non-transitory storage media also embraces cloud-based storage systems and structures, although the scope of the invention is not limited to these examples of non-transitory storage media.

Computer-executable instructions comprise, for example, instructions and data which, when executed, cause a general purpose computer, special purpose computer, or special purpose processing device to perform a certain function or group of functions. As such, some embodiments of the invention may be downloadable to one or more systems or devices, for example, from a website, mesh topology, or other source. As well, the scope of the invention embraces any hardware system or device that comprises an instance of an application that comprises the disclosed executable instructions.

Although the subject matter has been described in language specific to structural features and/or methodological acts, it is to be understood that the subject matter defined in the appended claims is not necessarily limited to the specific features or acts described above. Rather, the specific features and acts disclosed herein are disclosed as example forms of implementing the claims.

As used herein, the term module, component, engine, agent, client, or the like may refer to software objects or routines that execute on the computing system. The different components, modules, engines, and services described herein may be implemented as objects or processes that execute on the computing system, for example, as separate threads. While the system and methods described herein may be implemented in software, implementations in hardware or a combination of software and hardware are also possible and contemplated. In the present disclosure, a 'computing entity' may be any computing system as previously defined herein, or any module or combination of modules running on a computing system.

In at least some instances, a hardware processor is provided that is operable to carry out executable instructions for performing a method or process, such as the methods and processes disclosed herein. The hardware processor may or may not comprise an element of other hardware, such as the computing devices and systems disclosed herein.

In terms of computing environments, embodiments of the invention may be performed in client-server environments, whether network or local environments, or in any other suitable environment. Suitable operating environments for at least some embodiments of the invention include cloud computing environments where one or more of a client, server, or other machine may reside and operate in a cloud environment.

Figure 7:
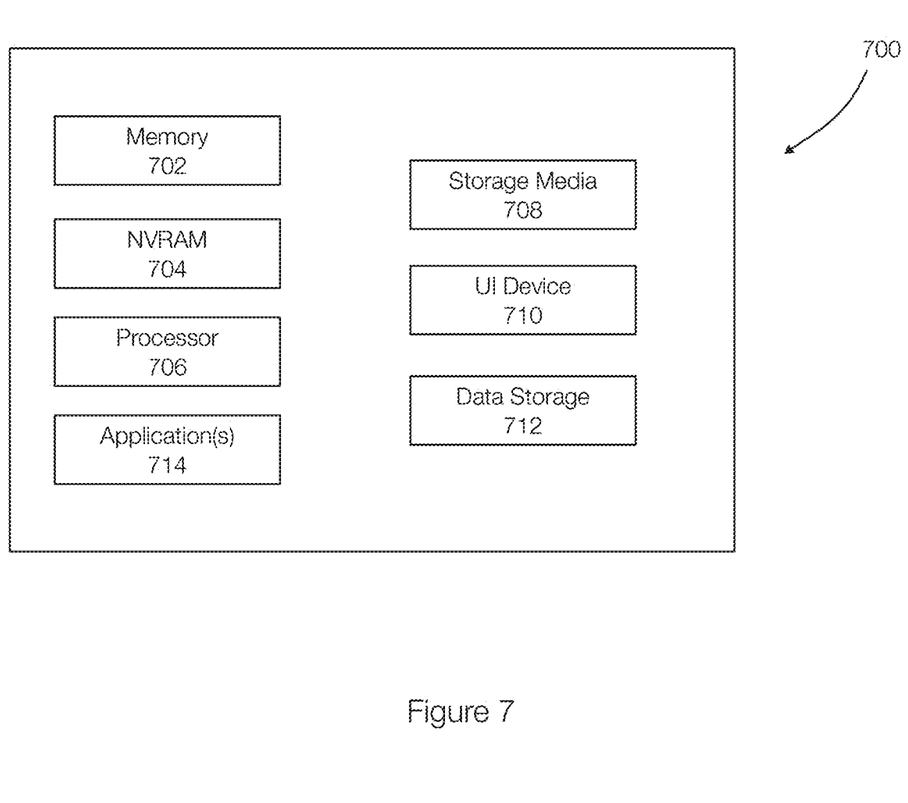
FIG. 7 discloses aspects of a computing device, system, or entity.

With reference briefly now to FIG. 7, any one or more of the entities disclosed, or implied, by the Figures, and/or elsewhere herein, may take the form of, or include, or be implemented on, or hosted by, a physical computing device, one example of which is denoted at 700. As well, where any of the aforementioned elements comprise or consist of a virtual machine (VM), that VM may constitute a virtualization of any combination of the physical components disclosed in FIG. 7.

In the example of FIG. 7, the physical computing device 700 includes a memory 702 which may include one, some, or all, of random-access memory (RAM), non-volatile memory (NVM) 704 such as NVRAM for example, read-only memory (ROM), and persistent memory, one or more hardware processors 706, non-transitory storage media 708, UI device 710, and data storage 712. One or more of the memory components 702 of the physical computing device 700 may take the form of solid state device (SSD) storage. As well, one or more applications 714 may be provided that comprise instructions executable by one or more hardware processors 706 to perform any of the operations, or portions thereof, disclosed herein.

Such executable instructions may take various forms including, for example, instructions executable to perform any method or portion thereof disclosed herein, and/or executable by/at any of a storage site, whether on-premises at an enterprise, or a cloud computing site, client, datacenter, data protection site including a cloud storage site, or backup server, to perform any of the functions disclosed herein. As well, such instructions may be executable to perform any of the other operations and methods, and any portions thereof, disclosed herein.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method comprising:
   receiving, at a reconstruction engine over a network, a sequence of lossy compression data that has been generated at a device, wherein the sequence of lossy compression data was generated by compressing a sequence of data with a lossy compression operation;
   decompressing the lossy compression data to generate decompressed data;
   providing the lossy compression data, the decompressed data, and at least one past sequence as input to a reconstruction model associated with the reconstruction engine to generate a residue that is configured to reduce a distance between the decompressed data and the sequence of data; and
   generating corrected decompressed data by combining the decompressed data with the residue.

2. The method of claim 1, wherein the lossy compression data comprises a compressed signal vector that has been quantized and binarized, the compressed signal vector comprising an array of values associated with the compression performed at the device.

3. The method of claim 2, further comprising generating a reconstructed compressed signal vector by reversing the binarization and quantization performed on the compressed signal vector.

4. The method of claim 3, wherein the decompressed data input to the reconstruction model further comprises the reconstructed compressed signal vector and the at least one past sequence comprises at least one past sequence of lossy compression data.

5. The method of claim 1, further comprising adding the residue to the decompressed data.

6. The method of claim 1, wherein the reconstruction model comprises a transformer-based neural network model or an MLP (Multilayer Perceptron) model.

7. The method of claim 1, wherein the sequence comprises a plurality of samples generated at the device.

8. The method of claim 1, further comprising training the reconstruction model using historical sequences of raw data from the device.

9. The method of claim 8, wherein a portion of the historical sequences are used as training data and a second portion of the historical sequences are used as testing data.

10. The method of claim 1, further comprising outputting a decompressed signal.

11. A non-transitory storage medium having stored therein instructions that are executable by one or more hardware processors to perform operations comprising:
    receiving, at a reconstruction engine over a network, a sequence of lossy compression data that has been generated at a device, wherein the sequence of lossy compression data was generated by compressing a sequence of data with a lossy compression operation;
    decompressing the lossy compression data to generate decompressed data;
    providing the lossy compression data, the decompressed data, and at least one past sequence as input to a reconstruction model associated with the reconstruction engine to generate a residue that is configured to reduce a distance between the decompressed data and the sequence of data; and
    generating corrected decompressed data by combining the decompressed data with the residue.

12. The non-transitory storage medium of claim 11, wherein the lossy compression data comprises a compressed signal vector that has been quantized and binarized, the compressed signal vector comprising an array of values associated with the compression performed at the device.

13. The non-transitory storage medium of claim 12, further comprising generating a reconstructed compressed signal vector by reversing the binarization and quantization performed on the compressed signal vector.

14. The non-transitory storage medium of claim 13, wherein the decompressed data input to the reconstruction model further comprises the reconstructed compressed signal vector and the at least one past sequence comprises at least one past sequence of lossy compression data.

15. The non-transitory storage medium of claim 11, further comprising adding the residue to the decompressed data.

16. The non-transitory storage medium of claim 11, wherein the reconstruction model comprises a transformer-based neural network model or an MLP (Multilayer Perceptron) model.

17. The non-transitory storage medium of claim 11, wherein the sequence comprises a plurality of samples generated at the device.

18. The non-transitory storage medium of claim 11, further comprising training the reconstruction model using historical sequences of raw data from the device.

19. The non-transitory storage medium of claim 18, wherein a portion of the historical sequences are used as training data and a second portion of the historical sequences are used as testing data.

20. The non-transitory storage medium of claim 1, further comprising outputting a decompressed signal.

* * * * *

UNITED STATES PATENT AND TRADEMARK OFFICE
CERTIFICATE OF CORRECTION

| | | |
|---|---|---|
| PATENT NO. | : 12,438,555 B2 | Page 1 of 1 |
| APPLICATION NO. | : 18/158107 | |
| DATED | : October 7, 2025 | |
| INVENTOR(S) | : Vinicius Michel Gottin et al. | |

It is certified that error appears in the above-identified patent and that said Letters Patent is hereby corrected as shown below:

In the Specification

Column 6
Line 64, change "MPL Model" to – MLP Model –

Signed and Sealed this
Third Day of February, 2026

John A. Squires
*Director of the United States Patent and Trademark Office*